United States Patent [19]

Bischoff et al.

[11] 4,176,442
[45] Dec. 4, 1979

[54] METHOD FOR PRODUCING A SEMICONDUCTOR FIXED VALUE ROM

[75] Inventors: Erich Bischoff, Langenau; Jürgen Dangel, Ulm; Hans Schüssler, Ulm; Thomas Ricker, Ulm; Erich Stein, Ulm, all of Fed. Rep. of Germany

[73] Assignee: Licentia Patent-Verwaltung-G.m.b.H., Frankfurt, Fed. Rep. of Germany

[21] Appl. No.: 730,255

[22] Filed: Oct. 6, 1976

[30] Foreign Application Priority Data

Oct. 8, 1975 [DE] Fed. Rep. of Germany ....... 2545047

[51] Int. Cl.$^2$ ............................................ H01L 21/72
[52] U.S. Cl. ...................................... 29/571; 29/574; 29/576 B; 29/576 C; 29/578; 156/656; 156/657; 156/659.1; 365/104
[58] Field of Search ................ 156/648, 649, 656, 657, 156/659; 148/1.5; 29/571, 574, 576 B, 576 C, 578; 365/103, 104

[56] References Cited

U.S. PATENT DOCUMENTS

| | | | |
|---|---|---|---|
| 3,377,513 | 4/1968 | Ashby et al. | 365/103 |
| 3,717,852 | 2/1973 | Abbas et al. | 365/103 |
| 3,794,510 | 2/1974 | Scala et al. | 156/659 |
| 3,914,855 | 10/1974 | Cheney et al. | 365/104 |
| 3,925,767 | 12/1975 | Witteles et al. | 365/104 |
| 4,129,936 | 12/1978 | Takei | 29/518 |
| 4,139,907 | 2/1979 | Blahut et al. | 365/104 |

FOREIGN PATENT DOCUMENTS 4315731 12/1964 Japan .

*Primary Examiner*—Jerome W. Massie
*Attorney, Agent, or Firm*—Spencer & Kaye

[57] ABSTRACT

A method for producing a fixed value memory (Read only memory, ROM) in the form of a programmable, monolithically integrated circuit, in which the fixed information is introduced into a semiconductor memory as binary coded bit pattern in process stages integrated into or following the conventional production sequence for semiconductor circuits including the direct transfer of the occupation of the memory cells, as prepared by software, with the elimination of masks. An electron or ion beam, which is deflected by means of deflecting means under the control of a computer is used to produce a mask on the surface of the semiconductor memory to correspond to the coded bit pattern, and thereafter, by selective process steps, the memory cells of the memory circuit below are caused to receive the desired stored value.

7 Claims, 6 Drawing Figures

METHOD FOR PRODUCING A SEMICONDUCTOR FIXED VALUE ROM

BACKGROUND OF THE INVENTION

The present invention relates to a method for producing a semiconductor fixed value memory.

A semiconductor fixed value memory of integrated field effect transistors is disclosed in German Auslegeschrift No. 2,034,659, corresponding to U.S. Pat. No. 3,614,750 to John L. Janning. According to this patent, the transistors are arranged in rows and columns with pairs of source and drain electrodes and a contiguous gate electrode conductor pattern disposed on a substrate and covered by a dielectric coating. The gate electrode conductor pattern is interrupted at certain points in dependence on the information. This fixed value memory has the drawback that the fixed memory contents to be stored must already be known when the memory is produced since for every memory contents a specially adapted gate electrode conductor pattern must be provided. This makes it impossible to mass-produce and store such memories economically.

German Offenlegungsschrift No. 2,128,014 published December 14th, 1972, discloses another fixed value memory including field effect transistors in which parallel strips of opposite conductivity type are made in a semiconductor material. Disposed above and perpendicular to these semiconductor strips are parallel conductor strips which are insulated from the substrate and the regions of opposite conductivity type contained therein by an electrically nonconductive layer of differing thickness. The semiconductor substrate contains locations of opposite conductivity type next to the parallel strips of opposite conductivity type so that they are always disposed below the parallel conductor strips which are perpendicular thereto. This memory has the principal drawback that the high integration density desired for reasons of space utilization, i.e. density of memory cells on a substrate, cannot be attained.

Such electrically programmable circuits have moreover the principal drawback that higher voltages or currents, respectively, are required for writing in the bit pattern than is required for operation of the memory. Therefore, the design of the circuits involves insurmountable difficulties particularly with respect to design of the decoding and read-out circuits. Moreover, during manufacture, the insulating layer employed for programming must meet high requirements regarding density and uniformity which make production yields in such processes rather questionable. It is furthermore very difficult to include in the manufacturing sequence for the circuits, in addition to the conventional two different layer thicknesses for the gate and field regions, a third substantially thinner layer (about 300 A), because such thin layers are particularly subject to "pinholes" and thus unevennesses in the breakthrough voltage. Moreover, a connection produced at such breakthrough by an oxide is a very unstable contact because the contact resistance may change over several powers of ten particularly under temperature stresses.

SUMMARY OF THE INVENTION

It is the object of the present invention to provide a process for producing a fixed value memory in which a no-longer-variable bit pattern, which can be read out as desired, is introduced into a memory only after the memory has been equipped with fully operational memory cells, and with the process being economically applicable even in small numbers.

This is achieved by the method according to the present invention, in that the fixed information is introduced into a semiconductor memory as a binary coded bit pattern by additional process steps following the conventional production sequence for semiconductor circuits, which steps involve the direct transfer of information to the memory cells utilizing software and without requiring the prior production of individual masks. In particular, an electron or ion beam is deflected, by means of deflection means under the control of a computer, to initially produce a masking layer on the surface of the semiconductor memory with openings corresponding to the desired coded bit pattern, and by utilizing selective further processing the memory cells of the memory circuit below this masking layer are caused, via the openings, to accept a fixed memory value.

A fixed value memory designed according to the present invention is distinguished by a previously unachievable memory cell density. Additionally, since programming with a fixed memory content need be effected substantially only after completion of a manufacturing process resulting in operational memories, the possibility for economical mass production and storage is given.

DETAILED DESCRIPTION OF THE PREFERRED EMBODIMENTS

Figure 1:
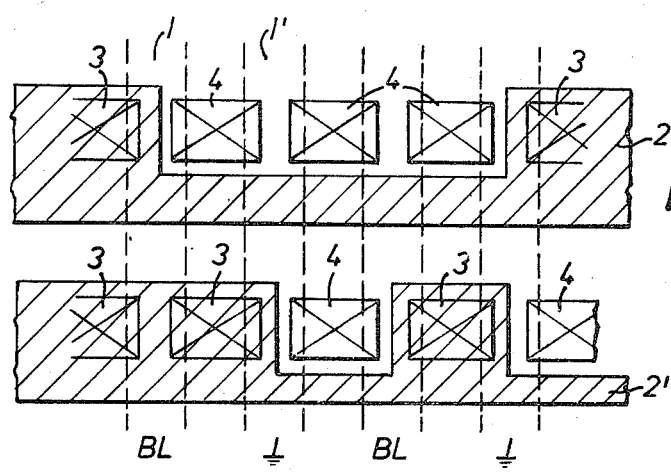
FIG. 1 is a schematic top view showing parts of two lines of a fixed value memory which has been processed according to one embodiment of the invention with memory cells arranged in a matrix according to the MOS technique.

A first embodiment of the invention is based on the structure of a known memory module with a matrix of memory cells in the form of field effect transistors, control circuits in two coordinate directions and read-out lines in one coordinate direction of the matrix. This is a fully operational memory module which can be checked, in particular, to determine the proper functioning of the individual memory cells. If any errors are discovered, malfunctioning memory modules can be culled out before they are processed into fixed value memories. Memory modules of the above-mentioned type include, for example, a semiconductor substrate of a first conductivity type in which parallel strip-shaped diffusion regions of a second conductivity type are disposed near the surface in a first coordinate direction of the matrix. The substrate material may here advisably be a p-conductive substrate material into which n-conductive regions are diffused to form the source or drain regions, respectively, of MOS transistors. Such a MOS transistor matrix is described e.g. in IBM Technical Disclosure Bulletin, Vol. 8, No. 8, January 1966, p. 1142.

The semiconductor substrate is covered with an insulating oxide layer with suitable thickness for field and gate regions, respectively on which metallic conductor paths are arranged to extend along a further coordinate direction in the matrix perpendicular to the diffusion regions. In the area of intersection between the diffusion regions and the conductor paths, which are separated from the diffusion regions by the insulating layer, there are the memory cells in the form of MOS transistors. The gate terminals of all MOS transistors of each row of the matrix, for example, are connected with a conductor path extending in the row direction. It is assumed that the switched-on state of each one of these MOS transistors corresponds to a logic "1".

A fixed memory content is assigned to such a memory module according to the invention in that, in the matrix of operational MOS transistors, those MOS transistors whose gate terminals are not connected to a conductor path which contacts all the other transistors of a row of the matrix are distributed according to a given bit pattern.

Advisably this is accomplished in a process step in which the surface of the memory module is initially covered with a conventional radiation sensitive lacquer layer (electron resist layer) which is then illuminated or exposed (to render same soluble) exactly above the gate terminals of the transistors to be separated or disconnected from the row conductors. This illumination or exposure is preferably effected by means of a focused electron or ion beam, which is selectively energized and guided as to its deflection under control of a programmed data processing system, over the surface of the memory matrix so that specific portions or regions of the lacquer layer are illuminated or exposed in correspondence with a given bit pattern.

A computer controlled electron beam arrangement suitable for mask making is described e.g. in J. Vac. Sci. Technol., Vol. 10, p. 10 52, 1973.

After removal of the exposed portions of the electron resist to form a resist mask with openings on the surface of the memory matrix, the exposed portions of the gate metallization of the transistor in question can be etched away entirely using conventional semiconductor etching processes. Each such transistor has assigned to it, for example, the logic value "0" which during later read-out of such a fixed value memory is recognized by the read-out circuit.

In order to definitely prevent surface states possibly present on the exposed gate oxide regions from leading to an undesirable switching action of a transistor treated in this manner, the initially exposed gate oxide regions are advisably covered with a nitride protective layer. Processes for producing such layers are known and employ the so-called MNOS process as described, for instance, in RCA Review, Vol. 30, p. 335, 1969.

It is, however, particularly advantageous to subject the surface of a memory module to ion implantation once the fixed value memory has been programmed in the above-described manner. Thus it is possible to set a stable state by shifting the threshold voltage in those transistors in which the gate metallization has been removed to store a fixed binary value. Due to the ion shielding effect of the remaining metal layer it need not be feared that the other transistors could be influenced. Shift of threshold voltage of MOS-transistors by ion implantation is disclosed for instance in Advances in Electronics and Electron Physics Vol. 37, p. 264, 1975.

Turning now to FIG. 1, there is shown a section comprising two rows of a fixed value memory matrix as described above. The numbers 1 and 1' indicate parallel extending diffusion regions of one conductivity type, which are shown in dashed lines and are disposed in a substrate (not specifically shown) of a first conductivity type. On an insulating layer (consisting of thin gate oxide in regions 3 and 4 and of thick field oxide in the remaining regions) which covers these diffusion regions as well as the substrate surface therebetween, mutually parallel conductor paths 2, 2' are disposed which contact the gate terminals of all MOS transistors of a row containing logic information of the one type. No transistors are formed in the regions of the conductors 2, 2', covering field oxide only. The gate regions of the transistors are marked 3. Separated from these conductor paths 2, 2' according to the process described above, are the gate terminals of the MOS transistors marked 4 in which a logic value of the other type, which cannot be changed, is stored.

In a further embodiment of a fixed value memory, it is possible to maintain defined switching states for the MOS transistors which are no longer connected to a common gate line by means of an etching process which etches away the gate oxide still present on these transistors down to the surface of the substrate material. It is not absolutely necessary in this connection to select an etching medium which is merely selective for this oxide because the metal layer covering the other transistors has such a great thickness compared to the dimensions of the gate oxide that it need not be feared that the etching medium will remove the metallic conductor paths to a point where operation of the circuit would be impaired in the time required to remove the gate oxide. In a known manner the substrate surface is then protected by a passivation layer, for example of amorphous silicon dioxide, which may additionally also cover the total area of the metallic conductor paths.

A further embodiment of a fixed value memory produced according to the method of the invention will be explained with reference to FIGS. 2 and 3. The basis is again, as in the embodiment of FIG. 1, a memory formed of a matrix of MOS transistors. The surface of the memory is again initially covered with a lacquer layer which is then illuminated by an electron beam so that individual MOS transistors having a fixed memory value are separated from the gate conductor path contacting the remaining MOS transistors of a row.

Figure 2:
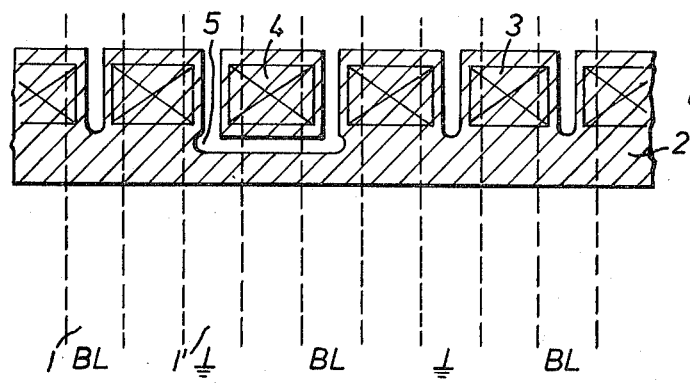
FIG. 2 is a schematic top view showing part of a line of a fixed value memory with memory cells arranged in a matrix according to the MOS technique which has been processed using a modification of the process according to the invention.
Figure 3:
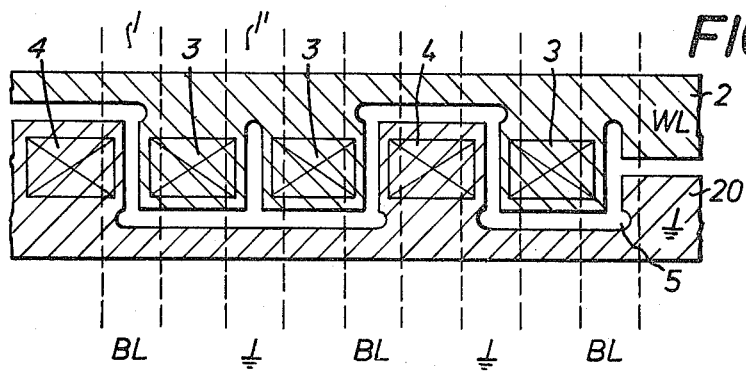
FIG. 3 is a schematic top view showing part of a line of a fixed value memory such as shown in FIG. 2 which has been processed according to another feature of the invention to provide an additional conductor path at ground potential.

In FIG. 2, the reference numeral 2 again refers to only the one conductor path which contacts the gate terminals 3 of all MOS transistors of a row of the matrix. An etched trough 5 produced in the process steps explained above separates an MOS transistor 4 from conductor path 2. This transistor 4, which in the illustrated embodiment still has the metal layer covering its gate terminal, has associated to it a fixed memory value. In order to assure a stable state for such separated transistors, it is advisable to connect the gate terminals of these transistors to a fixed potential, preferably ground potential. An arrangement for achieving this result in a simple manner is shown in FIG. 3. In this embodiment, a continuous trough 5 is formed by the masking and etching process described above, which essentially divides the row conductor into two conductors 2 and 20 which are selectively connected to the MOS transistors of the row according to their stored content. As shown, the gate terminals of the three MOS transistors marked 3 are connected to the common conductor path 2 extending in the direction of the row and functioning as the row conductor of the matrix. The two MOS transistors marked 4, which have been assigned a fixed memory value in the above-described process, are separated from this common line 2, but are connected, on the other hand, to ground potential via a line 20 which connects their gate terminals together.

According to the method of the invention, not only memories produced according to the MOS technique can be converted to fixed value memories, but moreover, memory modules made of bipolar memory cells can also advantageously be modified according to the invention to form fixed value memories.

Figure 4:
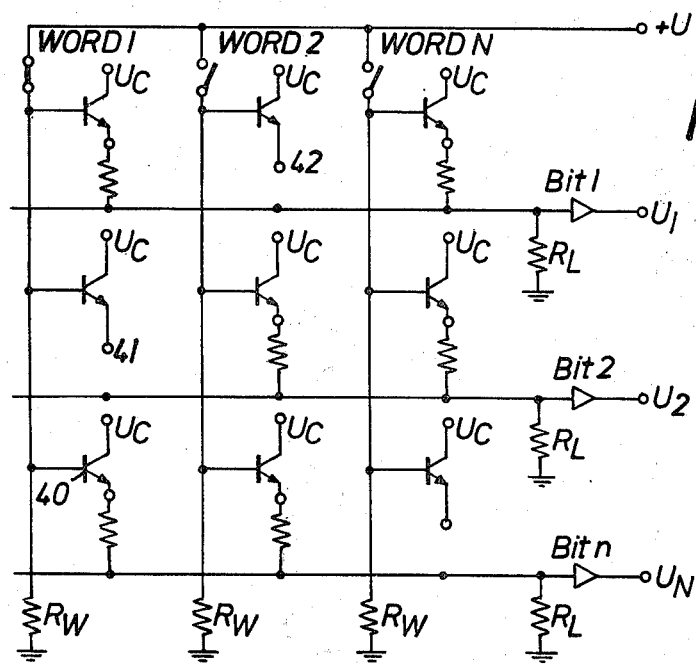
FIG. 4 is a schematic circuit of a fixed value memory matrix with bipolar memory cells which has been processed according to the invention.
Figure 5:
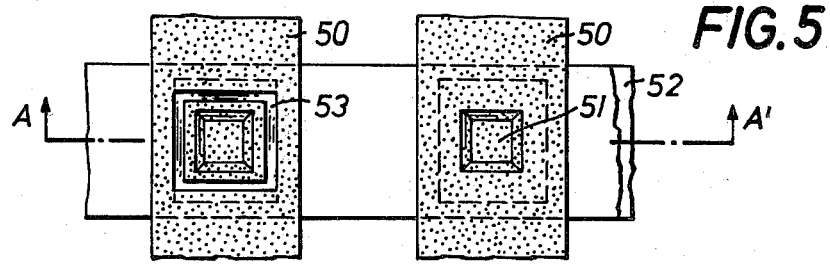
FIG. 5 is a schematic top view of a section of layout of a semiconductor fixed value memory matrix corresponding to the circuit of FIG. 4 with two memory cells.
Figure 6:
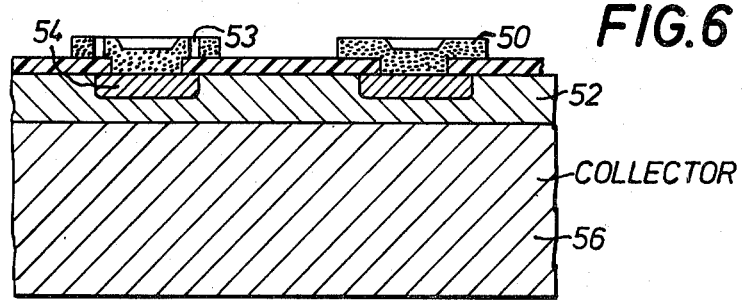
FIG. 6 is a sectional view along the line A—A' of FIG. 5.

FIG. 4 shows such a memory matrix with bipolar transistors 40. Preferably the transistors 40, as shown in FIG. 6, are vertical transistors having superimposed base, emitter and collector regions 52, 54 and 56, respectively. The collectors 56 of all transistors 40 are formed by the substrate of a solid state circuit which is connected to a voltage $U_C$. The storage of a fixed memory value according to the given bit pattern in such an arrangement is effected by severing the connecting line leading to the emitter of a respective transistor 40, e.g. as shown at 41 and 42. FIGS. 5 and 6 show, in a schematic representation, how the emitter contacts can be selectively severed from the row conductors according to the method of the invention.

In FIGS. 5 and 6, two conductor paths 50 are shown which normally contact the emitter regions of the transistors and which are arranged mutually parallel and extend perpendicularly to and over the base region 52. These conductors contact the emitter regions 54 via respective emitter contact openings 51. As shown, the transistor which is to have the fixed memory content is provided with a substantially rectangular trough 53 which surrounds the emitter contact opening 51 and separates the emitter from the lead 50. The trough 53 is produced with an electron beam according to the method of the present invention.

It will be understood that the above description of the present invention is susceptible to various modifications, changes and adaptations and the same are intended to be comprehended within the meaning and range of equivalents of the appended claims.

What is claimed is:

1. In a method for producing a fixed value memory in the form of a programmable, monolithically integrated circuit, wherein the fixed information is introduced into a semiconductor memory as a binary coded bit pattern in process stages integrated into or following the conventional production sequence for semiconductor circuits including the direct transfer of occupation of the memory cells as prepared by software, with the elimination of masks comprising the steps of: providing a semiconductor memory which was produced according to the MOS technique and including MOS transistor memory cells arranged to form a matrix and conductor paths substantially connecting the gate terminals of said transistors in rows arranged on the surface of said memory; producing a masking layer corresponding to the desired coded bit pattern on said surface of said memory by applying a layer of radiation sensitive lacquer (electron resist) to said surface of said memory and deflecting a focused electron beam according to a given bit pattern under the control of a computer to illuminate said lacquer layer at selected points to render the lacquer at the illuminated points soluble; and thereafter selectively processing said memory to cause the memory cells of the memory circuit below the masking layer to receive the stored value by removing the portions of the conductor paths disposed below the soluble portions of the lacquer in an etching process; the improvement wherein the potential of the gate terminals of the memory transistors is used as the information carrier and wherein said illuminated points are such as to cause selected gate terminals to be disconnected from the associated conductor during said etching process.

2. A method as defined in claim 1, further comprising: in an additional etching process, completely removing the gate oxide layers of the MOS transistors which were exposed in the mask openings; and covering at least the exposed regions of the surface of the semiconductor memory with a passivation layer.

3. A method as defined in claim 1 wherein said step of selectively processing further includes: additionally removing the metallization from the gate terminals of the transistors which are disconnected from the associated conductors according to the desired occupation; and thereafter implanting ions in these gate regions so as to set a stable switching state for the associated MOS transistor memory cell disposed therebelow.

4. A method as defined in claim 1 wherein: all of the memory transistors are represented in one memory matrix; the manufacturing process of the semiconductor memory takes place using conventional techniques to the point where the structure of the metallization layer for the conductors has been applied; the circuits are then tested and stored if desired; and are personalized according to the process of the invention to store the desired information as subsequently desired.

5. In a method for producing a fixed value memory in the form of a programmable, monolithically integrated circuit wherein the fixed information is introduced into a semiconductor memory as binary coded bit pattern in process stages integrated into or following the conventional production sequence for semiconductor circuits including the direct transfer of occupation of the memory cells as prepared by software, with the elimination of masks comprising the steps of producing a masking layer on the surface of the semiconductor memory corresponding to the desired coded bit pattern by the deflection of an electron or ion beam under the control of a computer, and thereafter selectively processing the memory to cause the memory cells of the memory circuit below the masking layer to receive the stored value; the improvement wherein: said semiconductor memory comprises a matrix of MOS transistor memory cells; the gate terminals of the MOS transistors are substantially connected together in rows by conductor paths on the surface of said semiconductor memory; said step of producing a masking layer includes applying a radiation sensitive lacquer layer to the surface of said semiconductor memory, illuminating selected portions of said lacquer layer by means of an electron beam according to a given pattern so that, after a subsequent etching process in which the illuminated portions of said lacquer layer as well as the portions of the metal layers disposed therebelow are removed, the gate terminals of all MOS transistors which are to store one of the two binary states of the desired bit pattern are separated from the conductor path connecting the MOS transistors in the associated rows; and said step of selectively processing comprises subjecting said memory to an etching process to remove the illuminated portions of the lacquer layer and the underlying metal layer portions.

6. A method as defined in claim 5 wherein said given pattern is such that the gate terminals of the MOS transistors which were separated from the row conductor according to the desired bit pattern are connected to a further conductor path which is at ground potential.

7. A method as defined in claim 5 wherein: all of the memory transistors are represented in one memory matrix; the manufacturing process of the semiconductor memory takes place using conventional techniques to the point where the structure of the metallization layer for the conductors has been applied; the circuits are then tested and stored if desired; and are personalized according to the process of the invention to store the desired information as subsequently desired.

* * * * *